United States Patent [19]

Kumar et al.

[11] Patent Number: 5,156,997
[45] Date of Patent: Oct. 20, 1992

[54] METHOD OF MAKING SEMICONDUCTOR BONDING BUMPS USING METAL CLUSTER ION DEPOSITION

[75] Inventors: Nalin Kumar; Rama R. Goruganthu; Mohammed K. Ghazi, all of Austin, Tex.

[73] Assignees: Microelectronics and Computer Technology Corporation, Austin, Tex.; Hughes Aircraft Company, Los Angeles, Calif.

[21] Appl. No.: 653,609

[22] Filed: Feb. 11, 1991

[51] Int. Cl.$^5$ ........................................... H01L 21/288
[52] U.S. Cl. ........................................... 437/183; 437/930
[58] Field of Search ..................... 437/183, 203, 930; 204/191.11, 298.04

[56] References Cited

U.S. PATENT DOCUMENTS 4,868,068  9/1989  Yamaguchi et al. ............... 437/195
4,876,112  10/1989  Kaito et al. ............................ 437/930

FOREIGN PATENT DOCUMENTS 58-87848  5/1983  Japan .................................. 437/930
63-76332  4/1988  Japan .................................. 437/930

Primary Examiner—Oiik Chaudhuri
Assistant Examiner—David E. Graybill
Attorney, Agent, or Firm—Fulbright & Jaworski

[57] ABSTRACT

A method of making bonding bumps on the pads of an electrical chip including depositing a layer of metallic adhesion material over the surface, depositing metallic bumps on the metallic adhesion material over each of the pad areas using a focused liquid metal ion source, and chemically etching the layer of metallic adhesion material off the surface outside of the deposited bumps.

20 Claims, 4 Drawing Sheets

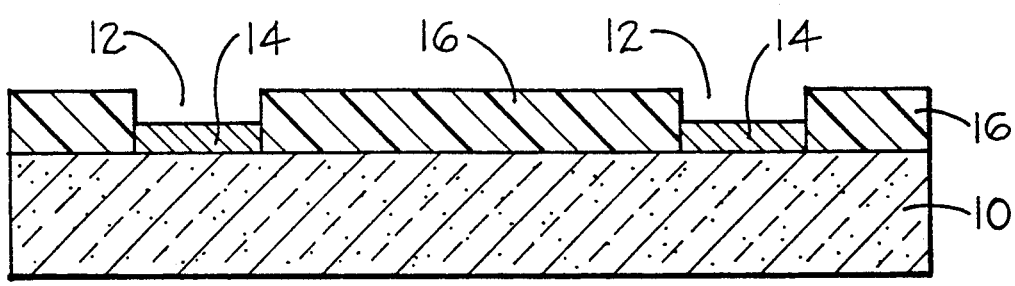
Fig. 1 PRIOR ART
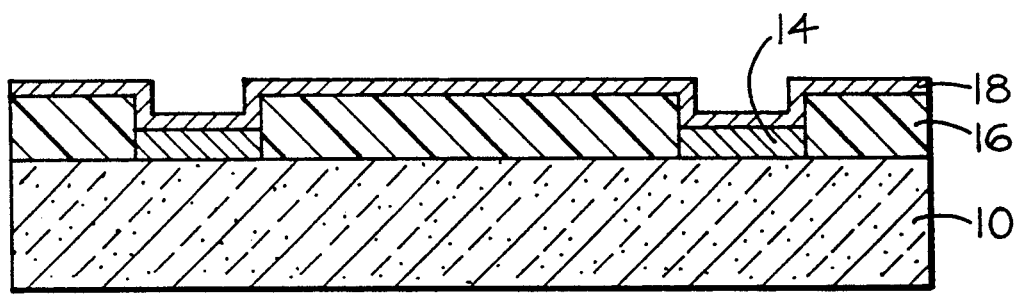
Fig. 2
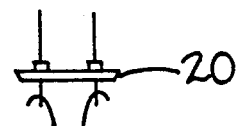
Fig. 3
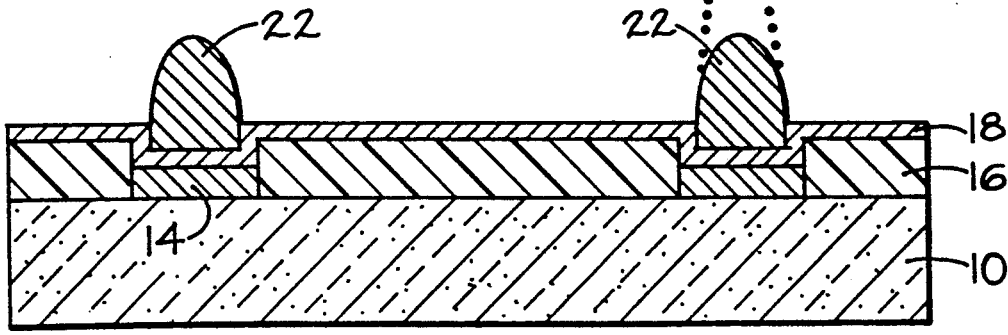

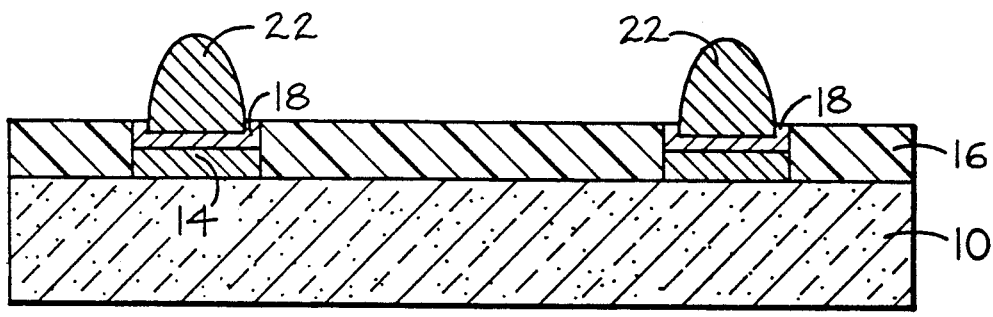
Fig. 4
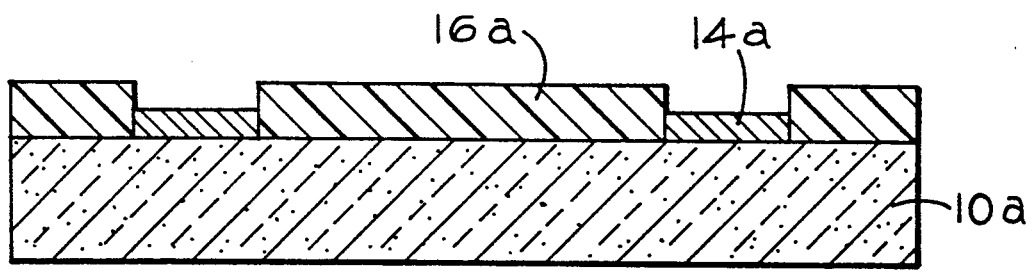
Fig. 5
Fig. 6
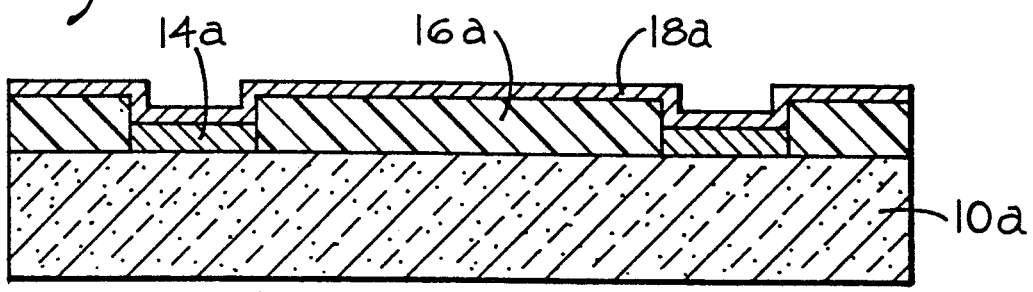

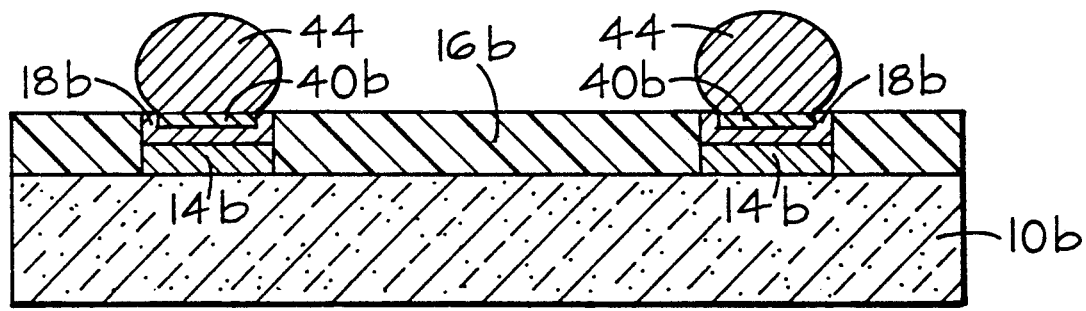
Fig. 10
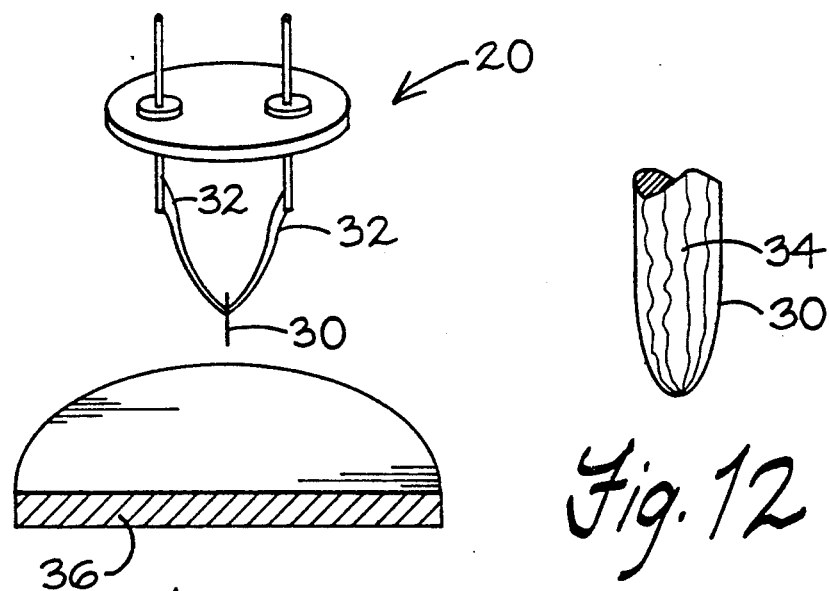
Fig. 11
Fig. 12

METHOD OF MAKING SEMICONDUCTOR BONDING BUMPS USING METAL CLUSTER ION DEPOSITION

BACKGROUND OF THE INVENTION

The present method is directed to making bonding bumps, for example, gold bumps on electrical substrates such as semiconductor chips where the chips are to be bonded to an interconnect board using tape-automated-bonding or flip chip technology.

Recently, most of the high performance electronic systems demand that either tape-automated-bonding (TAB) or flip chip bonding (FCB) be used as compared to wire bonding to attach the chip leads to the high density interconnect boards. These types of bonding require that the chip interconnect pads be higher than the rest of the chip so as to have thicker metal bumps (anywhere between 1 and 20 microns thicker than 1 micron thick aluminum required for wire bonding). However, chips normally have only thin metal pads for wire bonding and are not available with thick bumps. Thick bumps can be manufactured by the time-consuming process of photolithography using either a bump plating process of lift-off process.

The present invention provides a method of fabrication of bumps by using a direct metal writing tool by depositing bumps with a focused liquid metal cluster ion beam source.

SUMMARY

The present invention is directed to a method of making electrical connection bumps on pad areas of an electrical substrate, comprising depositing metallic bumps on the pad areas by localized metal cluster ion deposition.

The present invention is also directed to a method of making electrical connection bumps on pad areas of an electrical substrate which includes depositing a layer of a metallic material over the surface of the substrate including the pad areas, depositing metallic bumps over the pad areas by a focused cluster ion beam, and etching the layer of metallic material off the surface of the substrate outside the deposited bumps. The metallic bumps are deposited with a liquid metal ion source.

Preferably, the metallic bumps are selected from a group consisting of gold, indium, lead, tin, solder, copper, nickel and aluminum.

Still a further object of the present invention is wherein the substrate surface includes pads and the deposited metallic bumps are thicker than the thickness of the pads.

Yet a still further object of the present invention is wherein the aspect ratio of the metallic bumps is approximately one.

Still a further object of the present invention is wherein the deposited metallic bumps are approximately between 1 and 20 microns thick.

A further object includes depositing an additional second metallic bump on the first metallic bump. The second metallic bumps may be formed by electroless plating. The second metallic bumps are selected from a group consisting of lead, tin, nickel and gold.

Another method of making the additional second metallic bumps includes forming them by dipping the first bumps into a solder dip. Preferably, the solder dip is a low melting temperature metallic alloy.

A further object of the present invention is wherein the thickness of the second metallic bump is greater than the thickness of the first metallic bump thereby speeding up the process of fabricating bumps.

The present invention is further directed to a method of making bonding bumps on the pads of an electrical chip which includes depositing a layer of a metallic adhesion material over the surface of the chip including the pads, depositing a metallic bump over each of the pads using a liquid metal ion source that generates a focused metal cluster ion beam which impinges the pads, and chemically etching the layer of metallic material off the surface of the chip outside of the deposited bumps. Preferably, the metallic bumps are deposited while moving the chip relative to the focused spot of the cluster source in order to scan the pad areas. If necessary, any passivation layer is removed from the pads prior to depositing the metal adhesion material by a plasma etch, a chemical etch, or a combination of the two.

Other and further objects, features and advantages will be apparent from the following description of presently preferred embodiments of the invention, given for the purpose of disclosure, and taken in conjunction with the accompanying drawings.

BRIEF DESCRIPTION OF THE DRAWINGS

FIGS. 1–4 are schematic elevational views illustrating sequential steps of one method of fabricating bonding bumps on an electrical chip, FIGS. 5–9 are schematic elevational views illustrating sequential steps of another method of manufacturing bumps on an electrical chip, FIG. 10 is a schematic elevational view of one step in the manufacture of a bump on a chip which can be substituted for FIG. 9, FIG. 11 is a schematic perspective elevational view of a liquid metal ion source suitable for the fabrication of bumps in the present invention, and FIG. 12 is an enlarged view of the needle in FIG. 11.

DESCRIPTION OF THE PREFERRED EMBODIMENTS

Figure 7:
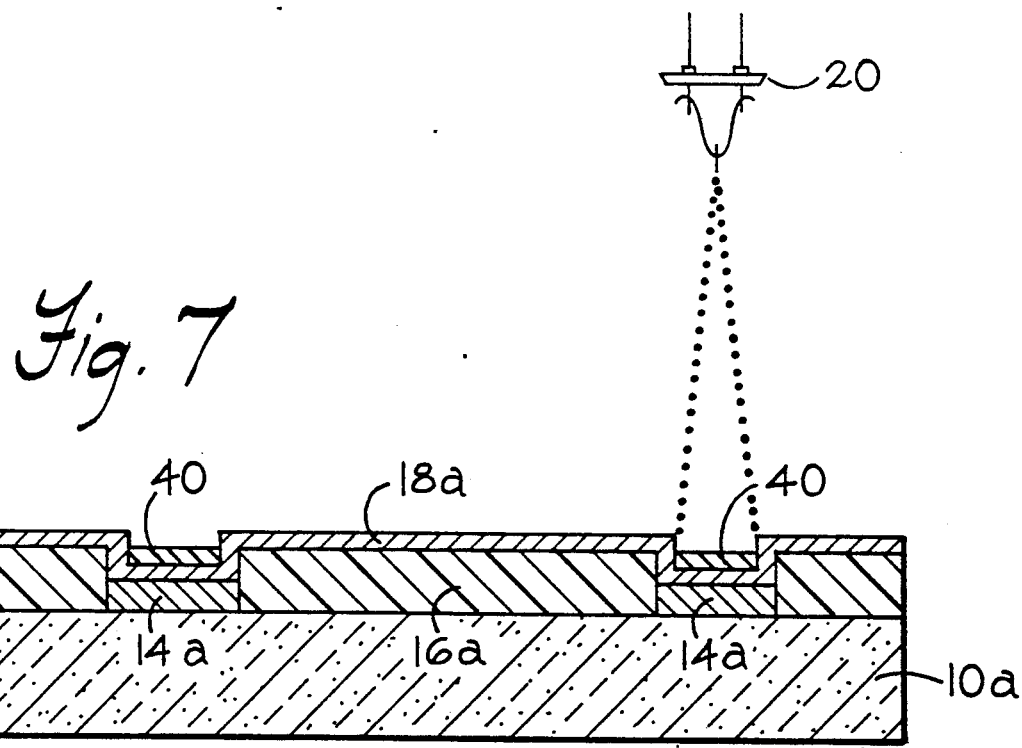

Referring now to the drawings, and particularly to FIG. 1, the reference numeral 10 generally indicates an electrical substrate such as a semiconductor chip having a plurality of pad areas 12, or as is conventional, aluminum metal pads 14 thereon to provide electrical connections to be bonded to interconnect boards such as using TAB or flip chip technology. Normally, the aluminum pads 14 would be relatively thin, such as one micron thick which, while suitable for wire bonding, would not provide suitable chip interconnect pads for TAB or flip chip bonding. In addition, the chip 10 may include a passivation layer 16 extending above the top of the chip. Thus, the structure shown in FIG. 1 is conventional.

Referring now to FIG. 2, in the process of fabricating chip interconnect bonding bumps, a first layer or plurality of layers 18 of an adhesion/barrier material is either sputtered or evaporated, by conventional methods, on the bare chip 10. If a passivation layer 16 covers the pads 14, the passivation layer must be removed from the pads 14 prior to this step.

Depending upon the pad metallurgy and the type of chip 10, the material used for layer 18 could be chromium, titanium, titanium-tungsten alloy, nickel or a combination of two or more of the above materials. The material may also be a compound such as titanium nitride, tantalum nitride, hafnium nitride, zirconium nitride, and titanium-tungsten nitride where the compound is either used alone or in conjunction with one or more of the aforementioned metals listed above. In the preferred embodiment, the layer 18 may be 500 angstroms of titanium applied by sputtering.

The purpose of the metallic adhesion layer 18 is several-fold. First, the layer 18 essentially provides an electrical short for all of the pads 14 on the chip 10 so that the high energy beam of the charged ions and clusters to be applied later does not destroy the delicate devices in the chip. Secondly, the layer 18 acts as an adhesion layer between the chip pad metal 14 (usually aluminum) and the bump metal to be applied, such as gold or solder. Thirdly, the layer 18 helps to spread the heat of the cluster beam to be applied over a large area so as to avoid the formation of hot spots under the pads 14. Fourthly, the pads 14, which are normally aluminum, have a thin native oxide layer on their surface. This oxide affects the adhesion to the pads 14. For example, solder cannot be plated directly on aluminum pads 14. Furthermore, bumps cannot be fabricated by dipping aluminum pads 14 in solder. Fifthly, the layer 18 acts as a diffusion barrier between the pads and the bump metal to be applied. The net effect of the layer 18 is to provide a surface on the pads 14 which will allow the deposition of bumps thereon which results in a very low contact resistance which is particularly important in very small bumps.

While a layer 18 is applied in the illustration set forth, it is understood that with certain other chips or substrates 10 it may be possible to perform the present invention without the need for a layer 18. That is, the metallic bumps can in some instances be deposited directly on the pads by a metal cluster ion beam without applying and etching layer 18. While this reduces the processing steps, the forementioned advantages of applying layer 18 are lost.

Referring now to FIG. 3, a liquid metal cluster source direct write tool 20, which will be described more fully hereinafter, is provided to deposit metallic bumps over the pad areas or pads 14 by a focused cluster ion beam. Preferably, the metallic material for the bumps is selected from a group consisting of gold, indium, lead, tin, solder, copper, nickel and aluminum with gold being the preferred material. The direct write tool 20 provides a method of making the necessary thicker bumps 22 for use as a chip interconnect bonding bump which is particularly useful for TAB or flip chip bonding. For example, the bumps 22 may be made between 1 and 20 microns thick, or thicker if required. In addition, the bumps 22 can be made with an aspect ratio of approximately 1. The bumps 22 can be made by moving the direct write tool 20 relative to the chip 10, but it is preferable to move the chip 10 in the X-Y horizontal directions while the tool 20 is stationary. In some cases, once chip 10 has been moved under a focused beam spot from direct write tool 20, the beam may be oscillated by electrical deflection to make the bumps 22 larger than the beam spot.

The commercial viability of a direct write tool 20 is determined by its throughput. A capillary type source with a total throughput of 105 cubic microns/second will be able to write one $100 \times 100 \times 10$ micron bump per second. This means that a 200 pad chip 10 can be bumped in less than four minutes. Actually, the throughput increases when the bump dimensions are decreased as is the recent trend for VLSI chips. For very small bumps (it will be easy to make one mil bumps), a needle type source (throughput of 1000 cubic microns/second) will be used.

As shown in FIG. 4, after depositing the bumps 22 over the pad areas or pads 14, to the proper dimensions, the adhesion layer 18 is etched off such as in a suitable wet etching solution. For example, in the case of a layer 18 of titanium, a wet etch of hydrofluoric acid can be used. This results in removal of all of the metal layer 18 except under the bumps 22. Due to the very small thickness of the layer 18, the undercut under the bumps 22 is minimized.

The direct writing tool 20 may be any suitable liquid metal ion source, for instance by depositing a focused cluster of ion beams as disclosed in C. D. Cruz and K. Pourrezaei, "Ion Cluster Emission and Deposition From Liquid Gold Ion Sources," *Journal of Applied Physics*, Vol. 58(7), Oct. 1, 1985, pp. 2724-2730. The disclosure for this article is hereby incorporated in its entirety by reference.

It is understood, however, that the present invention may use an unfocused liquid metal ion beam to fabricate the bumps. This can be done by bringing an electrical substrate in very close proximity, e.g. less than 1 mm, to the liquid ion metal source tip so that the deposited spot is smaller than the desired size of the bump.

As best seen in FIGS. 11 and 12, the direct write tool 20 may consist of a sharpened 380 micron straight tungsten wire 30 spot welded between a pair of tungsten wire loops 32. The surface of the tungsten needle 30 is made to have grooves 34 in its outer surface and the needle is coated with a suitable metallic bump material such as gold. When the needle 30 is resistively heated until the gold is molten and a positive potential of approximately ten kilovolts dc with respect to the extractor 36 is applied, intense ionization of the molten gold at the tip of the needle 30 occurs. Thus, a source for the cluster ion beam is provided for laying down metallic bumps on a chip 10.

As described in connection with the method of FIGS. 1-4, it is estimated that a 200 pad chip 10 can be provided with bumps 22 of a size of $100 \times 100 \times 10$ microns in four minutes. However, in order to provide bumps of the required thickness in less time, the method described in FIGS. 5-9 may be utilized.

FIG. 5 shows a chip 10a as the starting chip, which is identical to that shown in FIG. 1 having pad areas or aluminum pads 14a and an optional passivation layer 16a over the upper surface of the chip 10a excluding the pads 14a. In FIG. 6, an adhesion/barrier layer 18a which may be identical to layer 18 of FIG. 2 is provided with the preferred embodiment being 500 angstroms of titanium which is conventionally sputtered over the top surface of the pad 10a.

And in FIG. 7, metallic first bumps 40 are deposited over the pad areas or pads 14a. While the bumps 40 may be of any suitable material such as gold, indium, lead, tin, solder, copper, nickel and aluminum, the preference is gold. However, the first metallic bumps 40 are deposited in a thin form in order to speed up the fabrication of bumps. That is, the first metallic bumps 40, for example only, may be 500 angstroms thick of gold which are formed as in FIG. 3 by depositing the bumps 40 by a focused cluster ion beam. Because of the thinness of the first metallic bumps 40, they can be quickly fabricated over all of the pads 14a. The next step in FIG. 8, is the removal of the layer of metallic material 18a off of the surface of the chip 10a outside of the deposited first metallic bumps 40.

Figure 8:
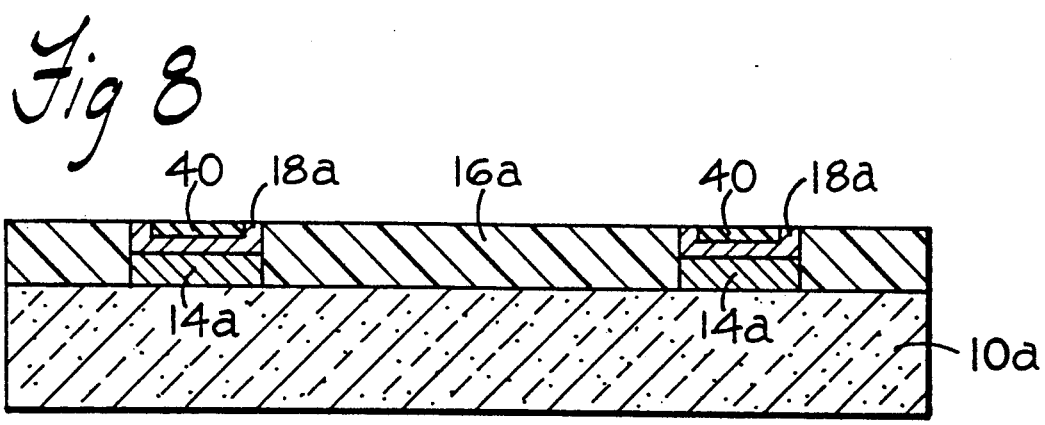
Figure 9:
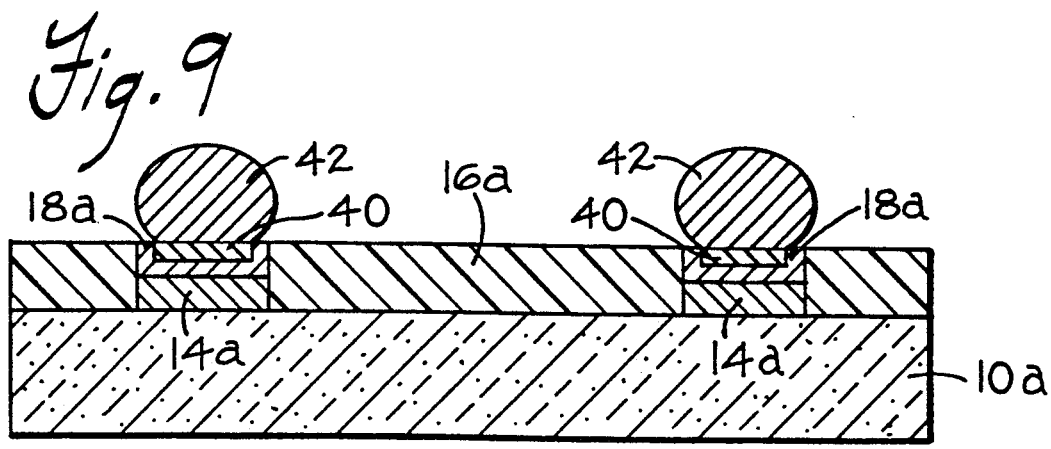

Referring now to FIG. 9, a second metallic bump 42 may be applied to each of the first metallic bumps 40 by a faster process than the direct write tool using a liquid metal ion source in the step described in FIG. 8. For example, the second metallic bumps 42 can be applied to the first bumps 40 by a conventional electroless plating process using any suitable metal such as gold, tin, or lead. Therefore, the process of FIGS. 5-9 provides a larger throughput of fabricated bumps than the process described in FIGS. 1-4. However, the electroless plating process of FIGS. 5-9 may degrade certain chips and thus be unacceptable.

Referring now to FIG. 10, a further method of producing the second bumps is provided. In FIG. 10, the method shown can be substituted for the step shown in FIG. 9. That is, a chip 10b is provided which is the same as the structure in FIG. 8 with the exception of the suffix "b". However, in FIG. 10, the second bumps 44 are deposited onto the first bumps 40b by a conventional solder dip process. That is, the first metallic bumps 40b are dipped into a suitable lead-tin solder dip. Any suitable solder having a low melting temperature metallic alloy is suitable. For example, another suitable solder dip would be an alloy of indium-bismuth-tin. In any event, the final steps of FIGS. 9 and 10 are advantageous in speeding up the process of fabricating bumps in that the first bumps 40 and 40b applies a metallic layer, such as gold, which provides a base for the additional second metallic bumps 42 and 44 in FIGS. 9 or 10, respectively, which can be more quickly applied. It is to be noted that the steps in FIGS. 8 and 9 or 10 are additionally speeded up by the fact that the first metallic bumps 40 and 40b are thinner than the second metallic bumps 42 and 44, respectively. That is, the materials which have a slower application in first metallic bumps 40 and 40b are thinner, while the more quickly applied second metallic bumps 42 and 44 are thicker to provide the composite required thickness.

The present invention, therefore, is well adapted to carry out the objects and attain the ends and advantages mentioned as well as others inherent therein. While presently preferred embodiments of the invention have been described for the purpose of disclosure, numerous changes in the details of construction and steps of the process will be readily apparent to those skilled in the art and which are encompassed within the spirit of the invention and the scope of the appended claims.

What is claimed is:

1. A method of making electrical connection bumps on pad areas of an electrical substrate, comprising:
   depositing metallic bumps on the pad areas by localized metal cluster ion deposition.

2. The method of claim 1 wherein the localized metal cluster ion deposition is provided by an ion beam generated from a liquid metal ion source.

3. The method of claim 2 wherein the metallic bumps are deposited at a focused spot of the ion beam.

4. The method of claim 2 wherein the pad areas are spaced less than 1 mm from the ion source, thereby allowing the bumps to be deposited from an unfocused ion beam.

5. A method of making electrical connection bumps on pas areas of an electrical substrate, comprising the following steps in the sequence set forth:
   depositing a layer of a metallic material over the surface of the substrate including the pad areas,
   depositing metallic bumps over the pad areas by a metal cluster ion beam, and
   etching the layer of metallic material off the surface of the substrate outside the deposited bumps.

6. A method of making electrical connection bumps on pad areas of an electrical substrate, comprising the following steps in the sequence set forth:
   depositing a layer of a metallic material over the surface of the substrate including the pad areas,
   depositing first metallic bumps over the pad areas by a focused metal cluster ion beam, and
   etching the layer of metallic material off the surface of the substrate outside the deposited bumps.

7. The method of claim 6 wherein the first metallic bumps are deposited with a liquid metal ion source.

8. The method of claim 6 wherein the first metallic bumps are selected from the group consisting of gold, indium, lead, tin, solder, copper, nickel, and aluminum.

9. The method of claim 6 wherein the deposited first metallic bumps are thicker than the pad areas.

10. The method of claim 6 wherein the aspect ratio of the first metallic bumps is approximately one.

11. The method of claim 6 wherein the deposited first metallic bumps are between 1 and 20 microns thick.

12. The method of claim 6 including depositing second metallic bumps on each of the first metallic bumps.

13. The method of claim 12 wherein the second metallic bumps are formed by electroless plating.

14. The method of claim 12 wherein the second metallic bumps are selected from the group consisting of lead, tin, nickel and gold.

15. The method of claim 12 wherein the second metallic bumps are formed by dipping the first metallic bumps in a solder dip.

16. The method of claim 15 wherein the solder dip is a low temperature metallic alloy.

17. The method of claim 12 wherein the thickness of the second metallic bumps is greater than the thickness of the first metallic bumps.

18. A method of making bonding bumps on the pads of an electrical chip, comprising the following steps in the sequence set forth:
   depositing a layer of a metallic adhesion material over the surface of the chip including the pads,
   depositing a metallic bump over each pad using a liquid metal ion source which generates a focused metal cluster ion beam which impinges a focused spot on the metallic adhesion material over each pad, and
   chemically etching the layer of metallic adhesion material off the surface of the chip outside the deposited bumps.

19. The method of claim 18 wherein the chip is moved horizontally relative to the focused spot so that the metallic adhesion material over each pad is scanned by the focused spot and the deposited bumps have a larger area than the focused spot.

20. The method of claim 18, further comprising horizontally oscillating the ion beam by electrical deflection so that the metallic adhesion material over each pad is scanned by the focused spot and the deposited bumps have a larger area than the focused spot.

* * * * *